US008878300B1

(12) United States Patent
Liu et al.

(10) Patent No.: US 8,878,300 B1
(45) Date of Patent: Nov. 4, 2014

(54) SEMICONDUCTOR DEVICE INCLUDING OUTWARDLY EXTENDING SOURCE AND DRAIN SILICIDE CONTACT REGIONS AND RELATED METHODS

(71) Applicants: STMicroelectronics, Inc., Coppell, TX (US); Globalfoundries Inc, Grand Cayman (KY)

(72) Inventors: Qing Liu, Guilderland, NY (US); Ruilong Xie, Schenectady, NY (US)

(73) Assignees: STMicroelectronics, Inc., Coppell, TX (US); Globalfoundries Inc., Grand Cayman (KY)

( * ) Notice: Subject to any disclaimer, the term of this patent is extended or adjusted under 35 U.S.C. 154(b) by 0 days.

(21) Appl. No.: 14/030,048

(22) Filed: Sep. 18, 2013

(51) Int. Cl.
*H01L 21/70* (2006.01)
*H01L 21/336* (2006.01)
*H01L 29/66* (2006.01)
*H01L 29/78* (2006.01)

(52) U.S. Cl.
CPC ........ *H01L 29/785* (2013.01); *H01L 29/66795* (2013.01)
USPC .......................................... 257/368; 438/300

(58) Field of Classification Search
CPC .................. H01L 29/785; H01L 29/66795
USPC .......................................... 438/300; 257/368
See application file for complete search history.

(56) References Cited

U.S. PATENT DOCUMENTS

| | | | |
|---|---|---|---|
| 8,310,013 B2 | 11/2012 | Lin et al. | |
| 8,518,770 B2 | 8/2013 | Lin et al. | |
| 2012/0104472 A1* | 5/2012 | Xu et al. | 257/288 |
| 2012/0270393 A1 | 10/2012 | Pore et al. | |
| 2012/0298965 A1* | 11/2012 | Haensch et al. | 257/29 |
| 2014/0061794 A1* | 3/2014 | Cheng et al. | 257/347 |
| 2014/0167264 A1* | 6/2014 | Besser et al. | 257/741 |

\* cited by examiner

*Primary Examiner* — William D Coleman
(74) *Attorney, Agent, or Firm* — Allen, Dyer, Doppelt, Milbrath & Gilchrist, P.A.

(57) ABSTRACT

A method for making a semiconductor device may include forming a plurality of semiconductor fins on a substrate, forming a gate overlying the plurality of semiconductor fins, forming respective unmerged semiconductor regions on the semiconductor fins on opposing sides of the gate, and forming a dielectric layer overlying the unmerged semiconductor regions. The method may further include etching the dielectric layer to define contact recesses having recess bottoms exposing the unmerged semiconductor regions, forming a respective semiconductor layer on each of the exposed unmerged semiconductor regions to extend outwardly from adjacent portions of the recess bottom, and siliciding each of the semiconductor layers to define respective source and drain contacts extending outwardly from adjacent portions of the recess bottom.

20 Claims, 9 Drawing Sheets

SEMICONDUCTOR DEVICE INCLUDING OUTWARDLY EXTENDING SOURCE AND DRAIN SILICIDE CONTACT REGIONS AND RELATED METHODS

FIELD OF THE INVENTION

The present invention relates to the field of electronic devices and, more particularly, to semiconductor devices and related methods.

BACKGROUND OF THE INVENTION

Fin-based field effect transistors (FinFETs) are vertical transistor devices in which a semiconductor fin is located on a substrate and is used to define the source, drain, and channel regions of the device. The gate structure overlies the fin in the channel area, and in some configurations multiple fins may be used to provide a multi-gate transistor architecture. The multiple gates may be controlled by a single gate electrode, where the multiple gate surfaces act electrically as a single gate, or by independent gate electrodes.

One example FinFET device is set forth in U.S. Pat. No. 8,310,013 to Lin et al. The FinFET device includes a substrate of a crystalline semiconductor material having a top surface of a first crystal plane orientation, a fin structure of the crystalline semiconductor material overlying the substrate, a gate structure over a portion of the fin structure, and an epitaxial layer over another portion of the fin structure. The epitaxial layer has a surface with a second crystal plane orientation. The epitaxial layer and underlying fin structure include a source and drain region. The source region is separated from the drain region by the gate structure. A channel is defined in the fin structure from the source region to the drain region, and aligned in a direction parallel to both the surface of the epitaxial layer and the top surface of the substrate.

Despite the existence of such configurations, further enhancements in FinFET devices may be desirable in some applications, particularly next generation devices with relatively small dimensions.

SUMMARY OF THE INVENTION

A method for making a semiconductor device may include forming a plurality of semiconductor fins on a substrate, forming a gate overlying the plurality of semiconductor fins, forming respective unmerged semiconductor regions on the semiconductor fins on opposing sides of the gate, and forming a dielectric layer overlying the unmerged semiconductor regions. The method may further include etching the dielectric layer to define contact recesses having recess bottoms exposing the unmerged semiconductor regions, forming a respective semiconductor layer on each of the exposed unmerged semiconductor regions to extend outwardly from adjacent portions of the recess bottom, and siliciding each of the semiconductor layers to define respective source and drain contacts extending outwardly from adjacent portions of the recess bottom.

By way of example, the source and drain contacts may extend at least 15 nm from the recess bottoms. Furthermore, forming the respective semiconductor layers may comprise epitaxially growing the respective semiconductor layers. The method may further include forming a nitride layer on the unmerged semiconductor regions prior to forming the dielectric layer.

The method may also include forming respective sidewall spacers on opposing sides of the gate. By way of example, forming the gate may comprise forming a replacement metal gate (RMG). Additionally, forming the dielectric layer may comprise forming an interlayer dielectric (ILD) stack. Etching may comprise etching at least one self-aligned contact (SAC) etch recess adjacent the gate.

A related semiconductor device may include a substrate, a plurality of semiconductor fins on the substrate, a gate overlying the plurality of semiconductor fins, and unmerged semiconductor regions on the semiconductor fins on opposing sides of the gate. The semiconductor device may further include a dielectric layer overlying the unmerged semiconductor regions and having contact recesses therein having recess bottoms flush with the unmerged semiconductor regions, and a silicide region on each of the unmerged semiconductor regions to define respective source and drain contacts extending outwardly from adjacent portions of the recess bottom.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 8:
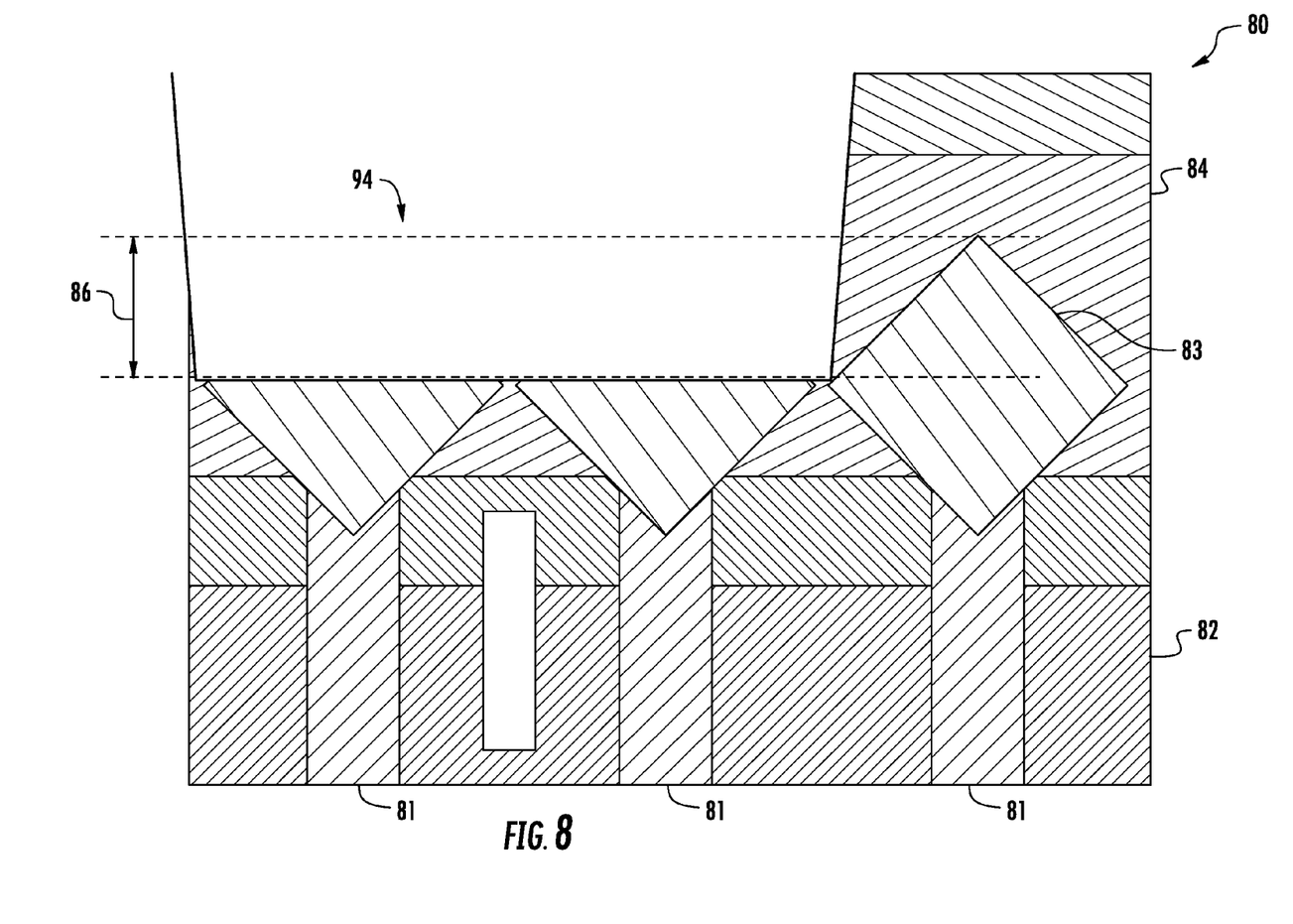
FIG. 8 is a cross-sectional diagram of a portion of a semiconductor device in accordance with one approach that has been used.

By way of background, with the relatively small dimensions to be used for next generation FinFET devices, unmerged fin or marginal-merged fin structures may be preferred to help prevent epitaxial overgrowth between adjacent fins. Yet, with unmerged fin configurations, gouging may present an issue during contact etch, as will now be described with reference to FIG. 8. In the illustrated example, a portion of a conventional FinFET device 80 includes semiconductor (e.g., silicon) fins 81 laterally surrounded by an insulating (e.g., $SiO_2$) layer 82. Epitaxial silicon regions 83 are grown on the fins, and another oxide layer 84 overlies the epitaxial silicon regions. When a contact etch is performed to define recesses 94, 96 exposing the epitaxial regions 83 at the source and drains, respectively, it may be difficult to control the precise depth of the contact etch, as indicated by the line 86 representing the variability of the etch depth range. When the etch extends too far into the epitaxial silicon regions 83, the silicidation (e.g., with NiPt) of the epitaxial semiconductor within the contact etch trench 94 may result in Ni "pipe" defects. Although a semiconductor (e.g., silicon) cap layer may be formed after the epitaxial deposition, this potentially introduces additional and unwanted lateral growth of the epitaxial silicon.

Figure 9A:
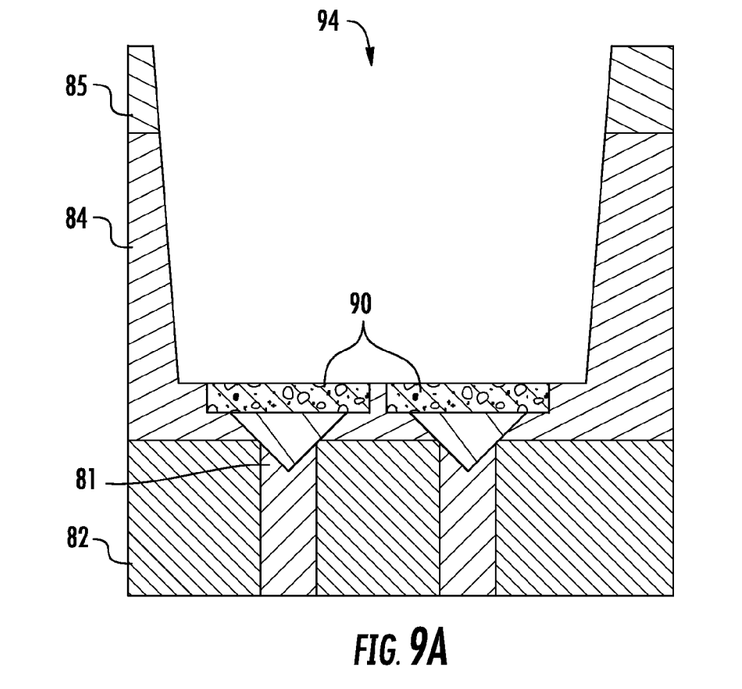
FIGS. 9a and 9b are cross-sectional diagrams of the prior art semiconductor device of FIG. 8 with views similar to those of FIGS. 7a and 7b.
Figure 9B:
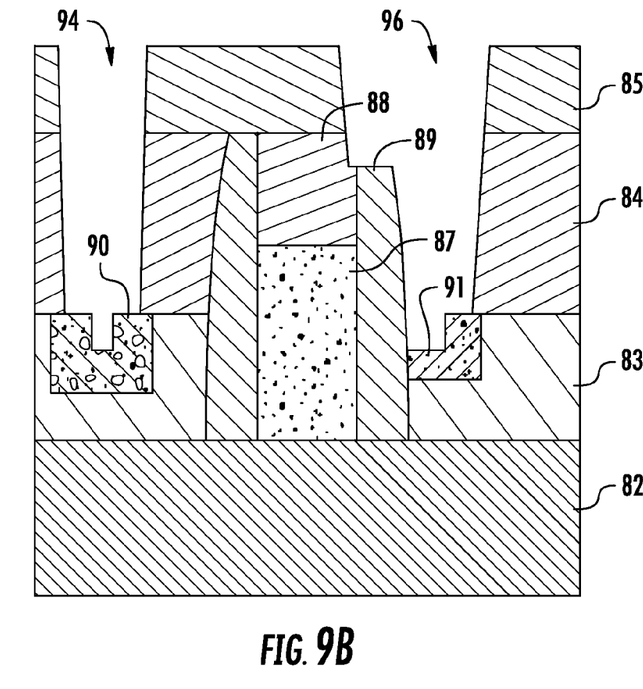

After silicidation, the structure would be as shown in FIGS. 9a and 9b. An oxide cap layer 85 overlies a replacement metal gate (RMG) structure having a silicon nitride cap 88 and sidewall spacers 89 (e.g., SiN) thereon. The epitaxial silicon regions are silicided to form source contact regions 90 and drain contact regions 91. Yet, as perhaps best seen in FIG. 9a, the gouging resulting from the contact over-etch causes the silicide to be relatively close to the bottom of the epitaxial silicon, and therefore the top of the fin 81, potentially leading to the above-noted pipe defects, for example.

Turning to FIGS. 1-7b, an example approach is now described for making a semiconductor device 30, such as a FinFET device, in which a selective undoped silicon epitaxial layer is formed post-contact etch, which later will be consumed by the silicide process to form source and drain contacts that extend outwardly from adjacent portions of the bottom of the contact etch recess. This approach helps to reduce lateral epitaxial growth and to prevent Ni "pipe" defects as well during silicidation.

Figure 2A:
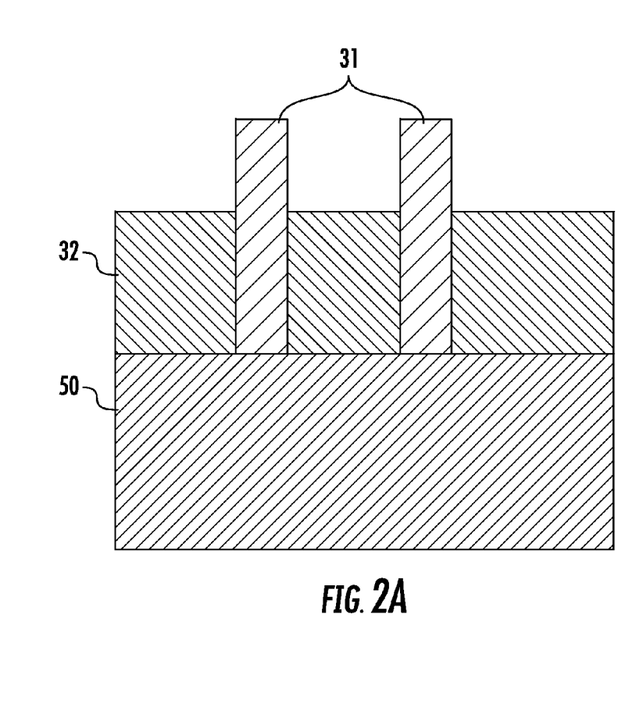
FIGS. 2a/2b, 3a/3b, 4a/4b, 5a/5b, 6a/6b, and 7a/7b are a series of cross-sectional diagrams illustrating an example method of making the semiconductor device of FIG. 1 respectively taken along lines a-a and b-b of FIG. 1.
Figure 2B:
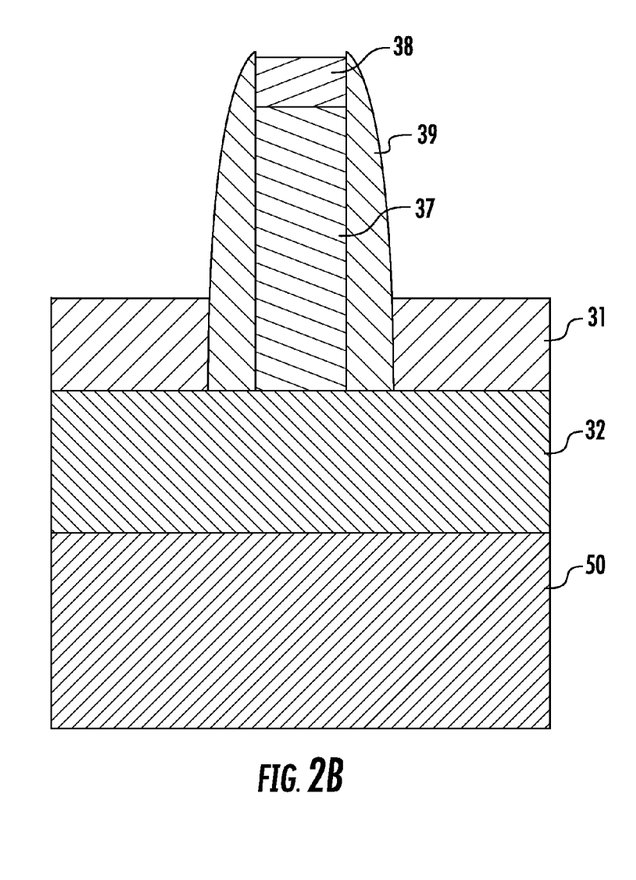

More particularly, a plurality of semiconductor (e.g., silicon) fins 31 are formed on a substrate 50 (e.g., a silicon substrate or SOI substrate). A dielectric layer 32 is formed on the substrate 50 and around lower portions of the fins 31, leaving upper portions of the fins exposed as shown. A gate 37 may then be formed overlying the plurality of semiconductor fins 31 and the dielectric layer 32. In FIG. 2b, the gate material is a temporary material that will later be replaced with a replacement metal gate (RMG), as will be appreciated by those skilled in the art. Silicon nitride is deposited to form sidewall spacers 39 for the gate 37, and a silicon nitride cap layer 38 is also deposited on the temporary gate.

Figure 3A:
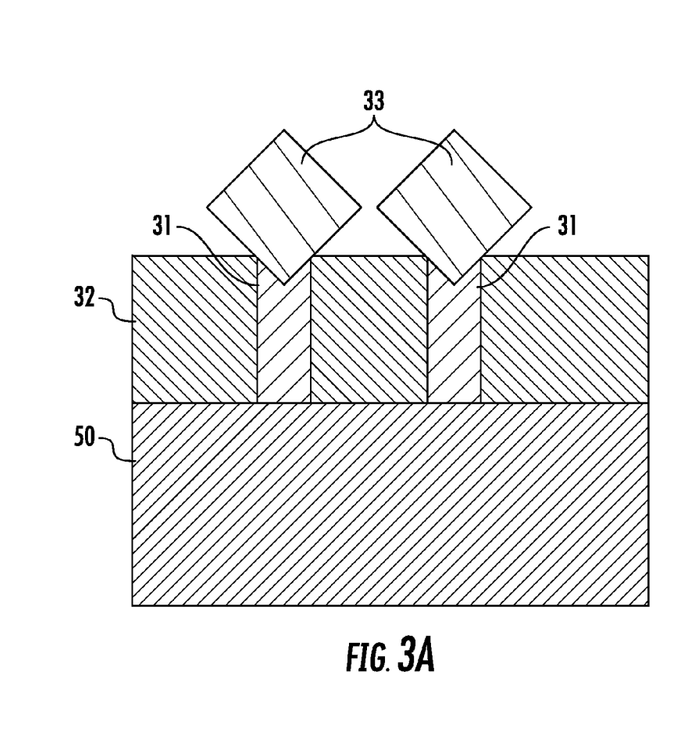
Figure 3B:
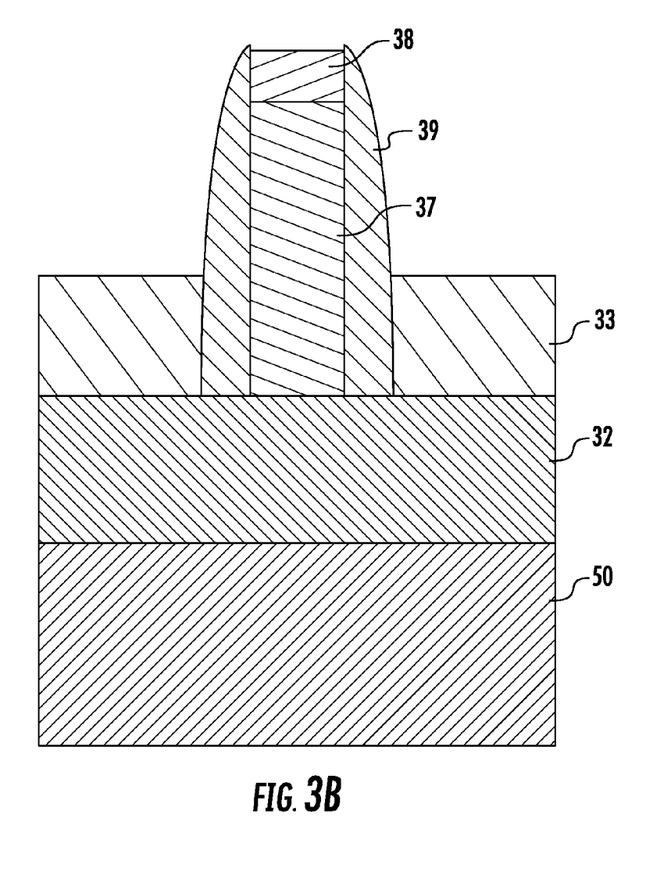
Figure 4A:
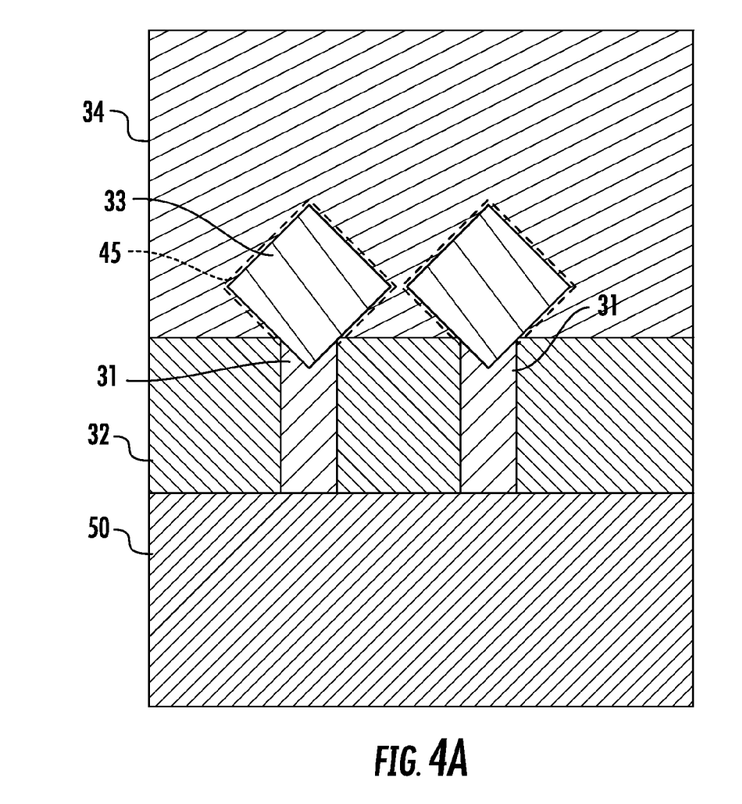
Figure 4B:
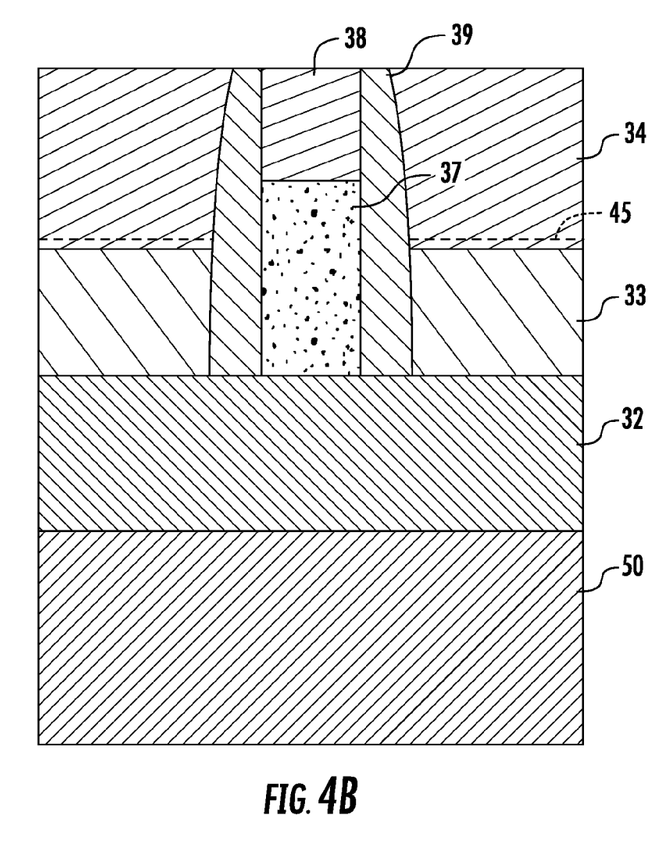

Respective unmerged semiconductor (e.g., silicon) regions 33 may then be grown on the semiconductor fins 31 on opposing sides of the gate 37, as shown in FIGS. 3a, 3b, and a dielectric layer(s) 34 may then be formed overlying the unmerged semiconductor regions (FIGS. 4a, 4b). By way of example, the dielectric layer 34 may be an interlayer dielectric (ILD) stack, although other suitable dielectric layer configurations may also be used. RMG processing may also be performed to incorporate the metal gate material, as will be appreciated by those skilled in the art. Furthermore, in some embodiments a respective nitride film or wrap layer 45 (indicated with a dashed line) may be formed on the unmerged semiconductor regions 33 prior to forming the dielectric layer 34, if desired.

Figure 5A:
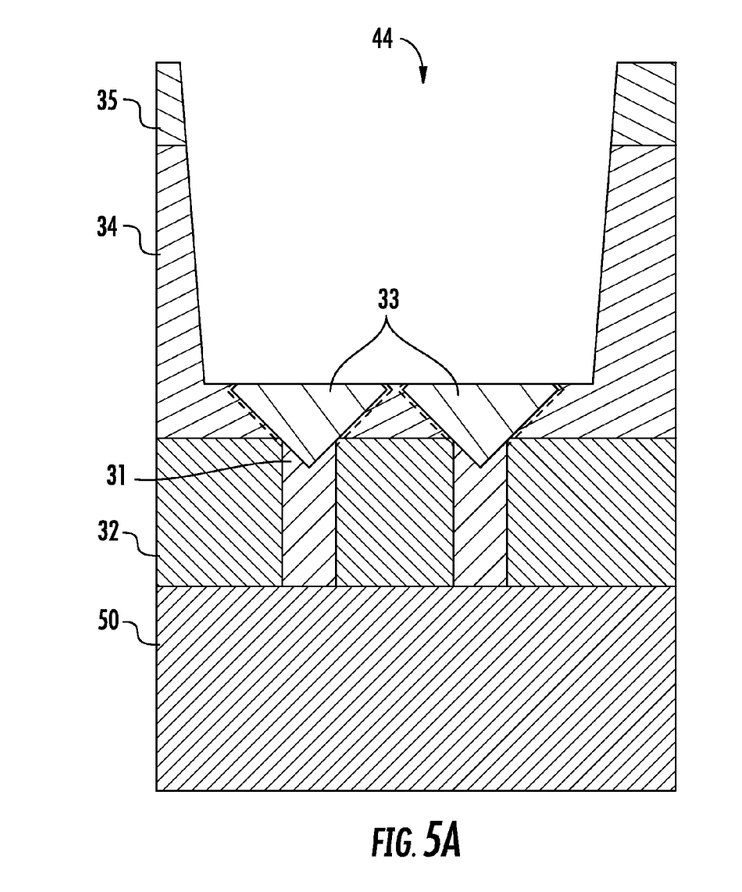
Figure 5B:
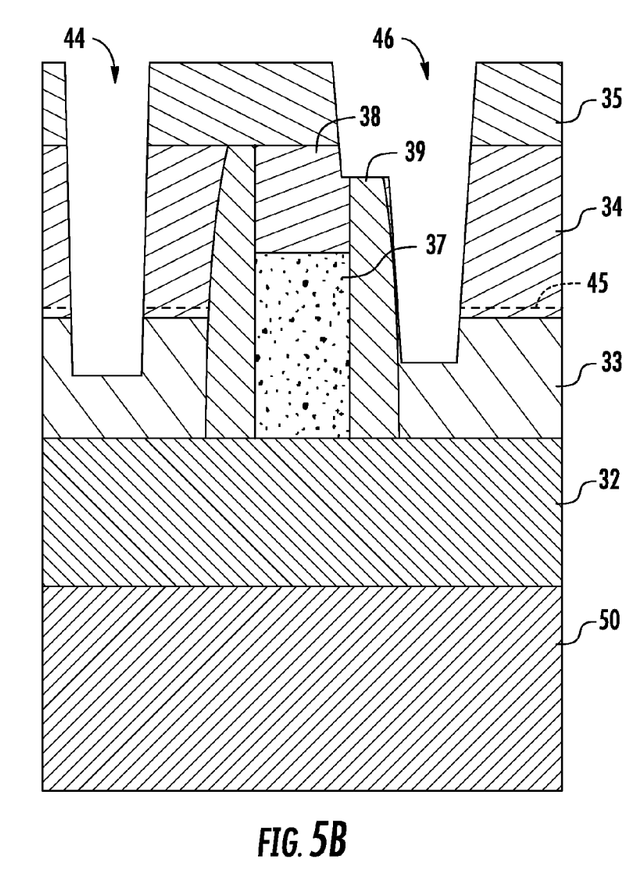

Deposition of an additional dielectric layer (e.g., ILD stack) 35 may optionally be performed, followed by the etching of the contact recesses or trenches 44. The dielectric layers 34, 35 are etched to define contact recesses or trenches 44, 46 having recess bottoms exposing the unmerged semiconductor regions 33, as seen in FIG. 5a and described further above. More particularly, in the illustrated example, the recesses 46 are self-aligned contact (SAC) recesses formed adjacent to (and overlapping) the gate 37 and sidewall spacer 39, as seen in FIG. 5b. However, SAC recesses need not be used in all embodiments, and in some embodiments both of the recesses 44 and 46 may be SAC recesses.

Figure 1:
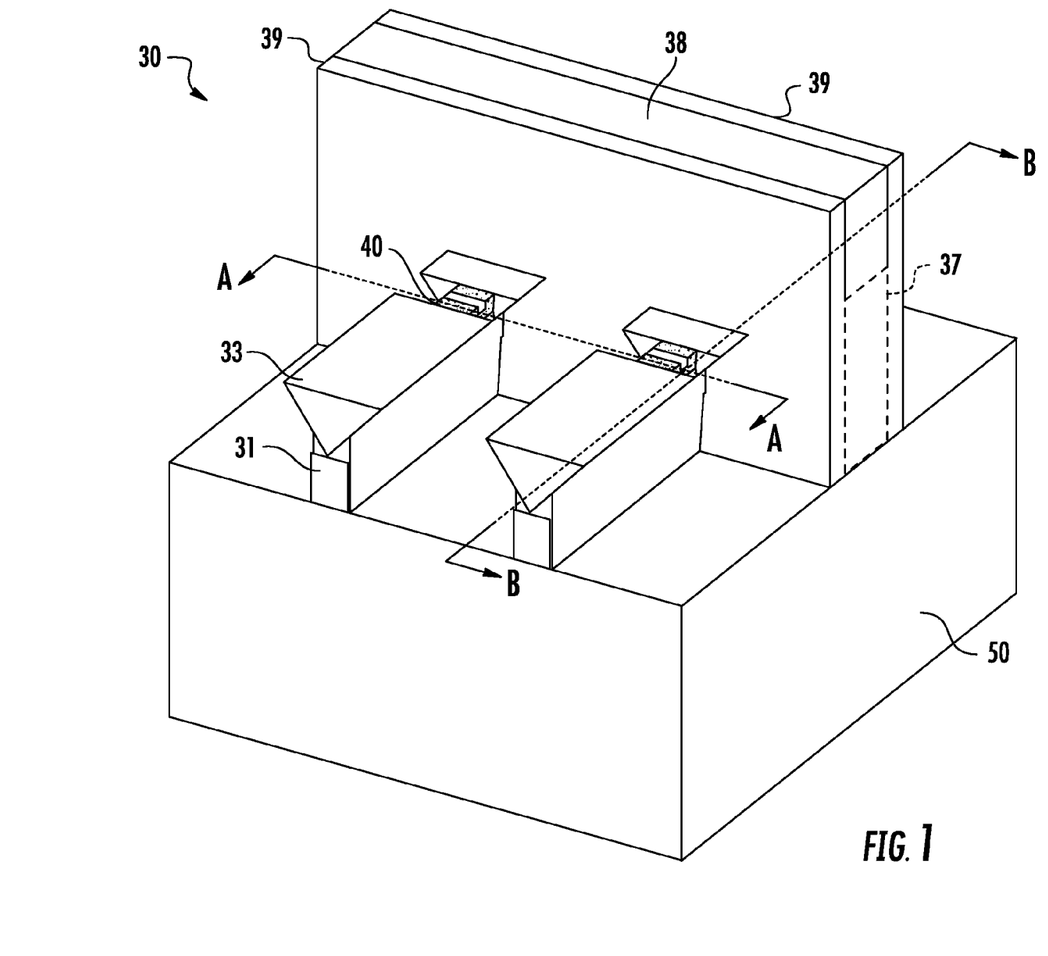
FIG. 1 is perspective view of a semiconductor device in accordance with an example embodiment.
Figure 6A:
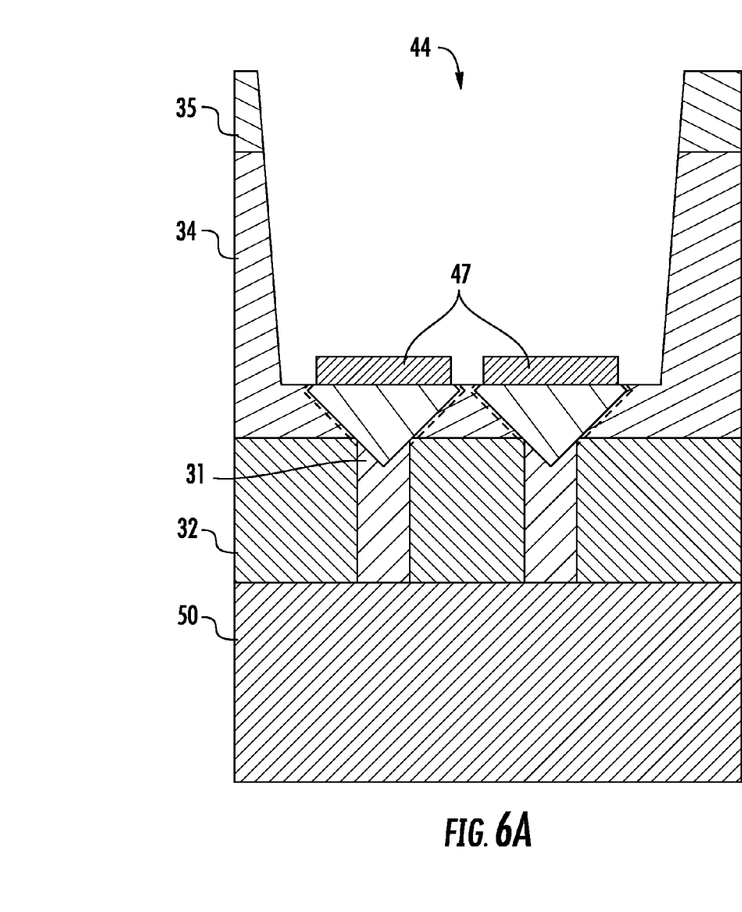
Figure 6B:
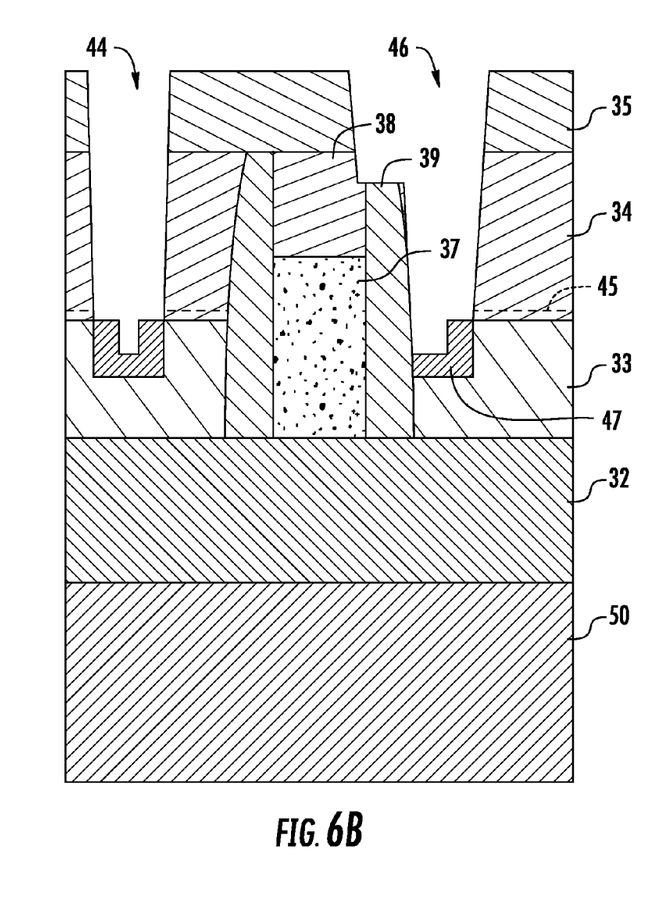
Figure 7A:
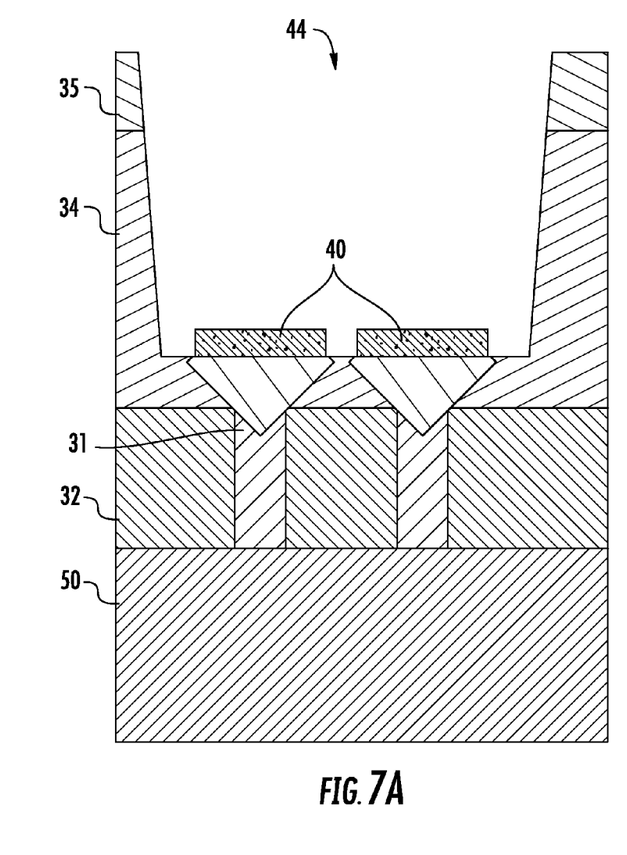
Figure 7B:
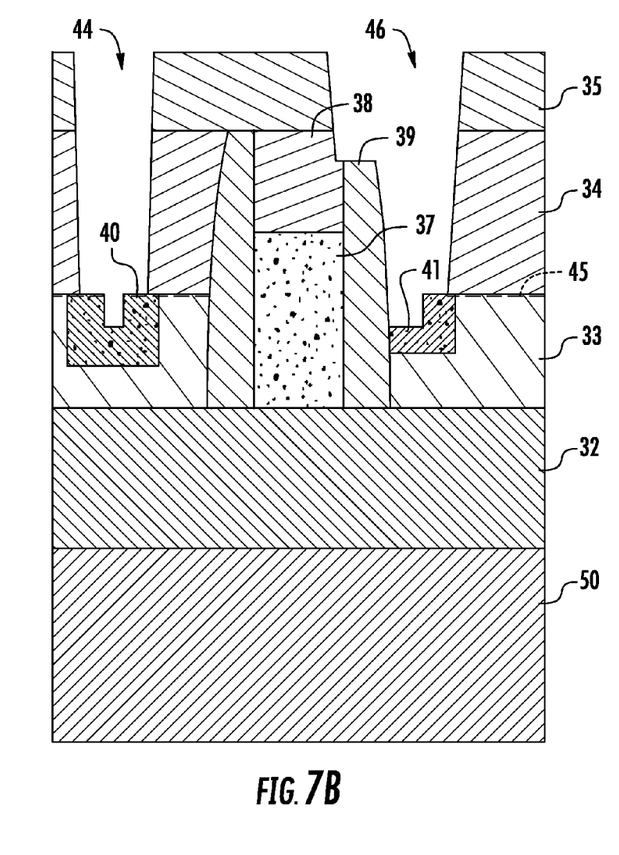

Rather than proceeding to silicide the unmerged semiconductor regions 33 at this point, as would occur with the conventional process described above with respect to FIGS. 9a, 9b, a respective semiconductor layer 47 (e.g., undoped silicon) is instead formed on each of the exposed unmerged semiconductor regions 33 to extend outwardly from adjacent portions of the recess bottom and sides, as seen in FIGS. 6a and 6b. In this regard, when siliciding is performed on each of the semiconductor layers 47 to define respective source and drain contacts 40, 41, the source and drain contacts will accordingly extend outwardly from adjacent portions of the recess bottom, as well as the sides of the recesses, as seen in FIGS. 7a and 7b. In this respect, the semiconductor layers 47 may conceptually be considered as sacrificial layers that are consumed by the silicide process. FIG. 1 provides a perspective view of the semiconductor device 30 following this source and drain contact siliciding step, similar to FIGS. 7a and 7b, but with the layers 32-35 removed so that the source contacts 40 are visible.

By way of example, the source and drain contacts 40, 41 may extend at least 15 nm from the recess bottoms and/or sides, and preferably in a range of about 10 to 25 nm, from the recess bottoms and/or sides for a 20 nm channel device. However, other dimensions may also be used in different configurations. As noted above, NiPt or other suitable silicide materials may be used, as will be appreciated by those skilled in the art.

As noted above, this approach advantageously helps to reduce lateral epitaxial growth and to prevent Ni "pipe" defects as well during silicidation, as will be appreciated by those skilled in the art. Following siliciding of the source and drain contacts 40, 41, further conventional processing steps may be performed to complete the semiconductor device 30, as will also be appreciated by those skilled in the art.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
    forming a plurality of semiconductor fins on a substrate;
    forming a gate overlying the plurality of semiconductor fins;
    forming respective unmerged semiconductor regions on the semiconductor fins on opposing sides of the gate;
    forming a dielectric layer overlying the unmerged semiconductor regions;
    etching the dielectric layer to define contact recesses having recess bottoms exposing the unmerged semiconductor regions;
    forming a respective semiconductor layer on each of the exposed unmerged semiconductor regions to extend outwardly from adjacent portions of the recess bottom; and
    siliciding each of the semiconductor layers to define respective source and drain contacts extending outwardly from adjacent portions of the recess bottom.

2. The method of claim 1 wherein the source and drain contacts extend at least 15 nm from the recess bottoms.

3. The method of claim 1 wherein forming the respective semiconductor layers comprises epitaxially growing the respective semiconductor layers.

4. The method of claim 1 further comprising forming a nitride layer on the unmerged semiconductor regions prior to forming the dielectric layer.

5. The method of claim 1 further comprising forming respective sidewall spacers on opposing sides of the gate.

6. The method of claim 1 wherein forming the gate comprises forming a replacement metal gate (RMG).

7. The method of claim 1 wherein forming the dielectric layer comprises forming an interlayer dielectric (ILD) stack.

8. The method of claim 1 wherein etching comprises etching at least one self-aligned contact (SAC) etch recess adjacent the gate.

9. A method for making a semiconductor device comprising:
- forming a plurality of semiconductor fins on a substrate;
- forming a gate overlying the plurality of semiconductor fins;
- forming respective unmerged semiconductor regions on the semiconductor fins on opposing sides of the gate;
- forming a dielectric layer overlying the unmerged semiconductor regions;
- etching the dielectric layer to define contact recesses having recess bottoms exposing the unmerged semiconductor regions;
- epitaxially growing a respective semiconductor layer on each of the exposed unmerged semiconductor regions to extend outwardly from adjacent portions of the recess bottom; and
- siliciding each of the semiconductor layers to define respective source and drain contacts extending at least 15 nm outwardly from adjacent portions of the recess bottom.

10. The method of claim 9 further comprising forming a nitride layer on the unmerged semiconductor regions prior to forming the dielectric layer.

11. The method of claim 9 further comprising forming respective sidewall spacers on opposing sides of the gate.

12. The method of claim 9 wherein forming the gate comprises forming a replacement metal gate (RMG).

13. The method of claim 9 wherein forming the dielectric layer comprises forming an interlayer dielectric (ILD) stack.

14. The method of claim 9 wherein etching comprises etching at least one self-aligned contact (SAC) etch recess adjacent the gate.

15. A semiconductor device comprising:
- a substrate;
- a plurality of semiconductor fins on said substrate;
- a gate overlying the plurality of semiconductor fins;
- unmerged semiconductor regions on the semiconductor fins on opposing sides of the gate;
- a dielectric layer overlying the unmerged semiconductor regions and having contact recesses therein having recess bottoms flush with the unmerged semiconductor regions; and
- a silicide region on each of the unmerged semiconductor regions to define respective source and drain contacts extending outwardly from adjacent portions of the recess bottom.

16. The semiconductor device of claim 15 wherein the source and drain contacts extend at least 15 nm from the recess bottoms.

17. The semiconductor device of claim 15 further comprising a nitride layer on the unmerged semiconductor regions.

18. The semiconductor device of claim 15 further comprising respective sidewall spacers on opposing sides of the gate.

19. The semiconductor device of claim 15 wherein the gate comprises a replacement metal gate (RMG).

20. The semiconductor device of claim 15 wherein the dielectric layer comprises an interlayer dielectric (ILD) stack.

* * * * *